United States Patent [19]

Ohsawa

[11] Patent Number: 5,521,402
[45] Date of Patent: May 28, 1996

[54] SEMICONDUCTOR OPTICAL FUNCTIONAL ELEMENT OF LOADING RESISTOR INTEGRATED TYPE

[75] Inventor: Yasuhiro Ohsawa, Sendai, Japan

[73] Assignees: Ricoh Company, Ltd., Tokyo; Ricoh Research Institute of General Electronics Co., Ltd., Natori, both of Japan

[21] Appl. No.: 407,259

[22] Filed: Mar. 20, 1995

Related U.S. Application Data

[63] Continuation of Ser. No. 168,159, Dec. 17, 1993, abandoned.

[30] Foreign Application Priority Data

Dec. 18, 1992 [JP] Japan ................................. 4-338555

[51] Int. Cl.$^6$ ....................... H01L 31/153; H01L 31/11
[52] U.S. Cl. ...................... 257/85; 257/462; 257/458; 257/197
[58] Field of Search ............................ 257/85, 458, 462, 257/197

[56] References Cited

U.S. PATENT DOCUMENTS

| | | | |
|---|---|---|---|
| 5,014,096 | 5/1991 | Matsuda et al. | 257/85 |
| 5,117,477 | 5/1992 | Sato et al. | |
| 5,200,605 | 4/1993 | Satoh et al. | |
| 5,260,586 | 11/1993 | Kondoh | 257/85 |
| 5,264,849 | 11/1993 | Kondoh et al. | |

OTHER PUBLICATIONS

Akio Sasaki, et al, "Light-To-Light Transducers With Amplification", IEEE Transactions on Electron Devices, vol. 35, No. 6, Jun. 1988, pp. 780–786.

K. Kasahara, et al, "Double Heterostructure Optoelectronic Swithch As A Dynamic Memory With Low–Power Consumption". Appl. Phys. Lett. 52(9), 29 Feb. 1988, pp 679–681.

N. Komaba, et al, "A New Opto–Electronic Device: Selfscanning Light Emitting Device (Sled)", Third Optoelectronic Conference (Dec'90) Technical Digest, Jul. 1990, Makuhari Messe, pp. 122–123.

Kenichi Matsuda, et al, "Integration of InGaAsP/Inp Optoelectronic Bistable Switches With a Function of Optical Earsing", IEEE Electron Devices Letters, vol. 11, No. 10, Oct. 1990, pp.442–444.

Primary Examiner—Jerome Jackson, Jr.
Attorney, Agent, or Firm—Oblon, Spivak, McClelland, Maier & Neustadt

[57] ABSTRACT

In a semiconductor optical functional element of a loading resistor integrated type, at least one loading resistor is integrated with the optical functional element. The optical functional element has a structure in which a phototransistor and a light emitting diode are adjacent to each other and are integrated with each other, or a phototransistor and a laser diode are adjacent to each other and are integrated with each other. The optical functional element is characterized in that light is fed back from a light emitting portion of the optical functional element to a light receiving portion thereof and a semiconductor layer is formed as the loading resistor in an uppermost layer of the optical functional element. The loading resistor can be manufactured by using the same manufacturing process as the optical functional element. Therefore, the manufacturing process of the loading resistor is simplified and a resistance value of the loading resistor can be easily controlled by controlling resistivity of a semiconductor.

9 Claims, 3 Drawing Sheets

SEMICONDUCTOR OPTICAL FUNCTIONAL ELEMENT OF LOADING RESISTOR INTEGRATED TYPE

This application is a Continuation of application Ser. No. 08/168,159, filed on Dec. 17, 1993, now abandoned.

BACKGROUND OF THE INVENTION

1. Field of the Invention

The present invention relates to an optical functional element as a basic element in optical information processing and optical transmission. More particularly, the present invention relates to an optical functional element of a loading resistor integrated type in which a light emitting portion, a light receiving portion and a loading resistor in a semiconductor are monolithically integrated with each other.

2. Description of the Related Art

Recently, expectation of parallel processing has been increased for processing a large amount of information at a high speed. However, there is a problem about a transmitting delay caused by wiring in a current electronic circuit so that there is a limit in processing speed. Therefore, a method for transmitting information by using light is devised to overcome the limit in electric wiring.

For example, as is well known, such an optical transmission element is constructed by an element provided by combining a phototransistor with a light emitting diode (see A. Sasaki et al., IEEE Trans. Electron Devices, Vol. 35, No. 6, pp. 780–786, 1988). Another optical transmission element is constructed by a light emitting thyristor having a pnpn structure (see K. Kasahara et al., Appl. Phys. Lett., Vol. 52, No. 9, pp. 679–681). When each of these optical functional elements is independently operated, an electric current flowing through each of the optical functional elements can be controlled by controlling a voltage even when there is no loading resistor. However, when many optical functional elements are arranged in array, it takes cost to attach an individual power source to each of the optical functional elements. Accordingly, such an attaching method is not practically used. Therefore, power is supplied to each of the optical functional elements from a single voltage source. At this time, when there is no loading resistor with respect to each of the optical functional elements arranged in array, an electric current concentratedly flows through only an optical functional element turned on. Accordingly, there is a problem that this optical functional element is broken and another optical functional element is not turned on even when light is irradiated onto this optical functional element. Therefore, a loading resistor is separately required for each of the optical functional elements arranged in array. Merits of a parallel arrangement of the optical functional elements are usefully provided by independently operating the element array. Further, it is desirable to monolithically integrate the optical functional elements with each other so as to make a functional element system compact with reduced cost and improve reliability of this system. Accordingly, it is important to monolithically integrate a loading resistor with each of the optical functional elements arranged in array.

An example of the optical functional element obtained by monolithically integrating the loading resistor therewith is shown by N. Komaba et at., Third Optoelectronics Conference (OEC' 90) Tech. Dig., 12B4-7, pp. 122–123, 1990. In this example, the loading resistor is constructed by a Cr-SiO cermet. Another example of the optical functional element is shown by K. Matsuda et al., IEEE Electron Device Lett., Vol. 11, No. 10, pp. 442–444, 1990. In this example, the loading resistor is manufactured by using a semiconductor layer below the optical functional element.

It is more desirable to simply manufacture the loading resistor with respect to the optical functional element obtained by monolithically integrating the loading resistor therewith. For example, if a resistance material except for a semiconductor is used for the loading resistor, different processes for manufacturing the loading resistor are required so that the manufacturing processes are complicated. In contrast to this, if the semiconductor is used for the loading resistor, a resistance layer can be simultaneously manufactured when a crystal grows. Accordingly, no additional processes are required and resistivity of a semiconductor layer is easily controlled. However, when there is a loading resistor layer below the optical functional element, it is necessary to remove this optical functional element to the loading resistor layer. In this case, a resistance value of the loading resistor is changed when a thickness of the loading resistor layer is changed. Accordingly, for example, the optical functional element above the loading resistor layer must be removed by using an etching method for precisely controlling a thickness of the optical functional element to the loading resistor layer below the optical functional element. Therefore, it is normally difficult to provide a suitable manufacturing process of the loading resistor layer.

SUMMARY OF THE INVENTION

It is therefore an object of the present invention to provide a semiconductor optical functional element in which at least one loading resistor is monolithically integrated with the optical functional element and a manufacturing process of the loading resistor is simplified as much as possible and controllability of a resistance value of the loading resistor is simultaneously improved by improving a structure of the loading resistor.

The above object of the present invention can be achieved by a semiconductor optical functional element of a loading resistor integrated type in which at least one loading resistor is integrated with the optical functional element; the optical functional element having a structure in which a phototransistor and a light emitting diode are adjacent to each other and are integrated with each other, or a phototransistor and a laser diode are adjacent to each other and are integrated with each other; and the optical functional element being characterized in that light is fed back from a light emitting portion of the optical functional element to a light receiving portion thereof and a semiconductor layer is formed as the loading resistor in an uppermost layer of the optical functional element.

Namely, in the present invention, the semiconductor layer in an uppermost portion of the optical functional element is used as the loading resistor by using a structure and insulating characteristics of the optical functional element.

In this semiconductor optical functional element of a loading resistor integrated type, for example, AlGaAs and GaAs are used as the semiconductor layer constituting the optical functional element.

In this semiconductor optical functional element of a loading resistor integrated type, for example, the optical functional element has a thyristor structure.

An operation of the optical functional element in the present invention will next be explained.

The optical functional element in the present invention will first be explained. When a voltage is applied to the optical functional element of the present invention in a forward direction, light is fed back within the optical functional element. Accordingly, when no light is inputted to the optical functional element, the optical functional element attains a high impedance turning-off state. In contrast to this, when light is inputted to the optical functional element, the optical functional element attains a low impedance turning-on state. When the applied voltage is increased in the high impedance turning-off state and exceeds a break-over voltage peculiar to the optical functional element, the high impedance turning-off state is suddenly changed to the low impedance turning-on state. In contrast to this, when the applied voltage is equal to or lower than the brake-over voltage, the high impedance turning-off state is held. When light is inputted to the optical functional element and the optical functional element is turned on, an electric current flows through the optical functional element so that the optical functional element emits light and this light is again absorbed into this optical functional element, thereby causing positive feedback of light. Accordingly, the turning-on state of the optical functional element is maintained. The applied voltage is reduced, whereby the turning-on state of the optical functional element is returned to the turning-off state. When the turning-on state of the optical functional element is set, an electric current limited by a loading resistor flows through the optical functional element. Therefore, a carrier is confined and light corresponding to energy at a forbidden band width of a semiconductor within the optical functional element is emitted from this optical functional element. Namely, light is emitted from the optical functional element in accordance with existence and nonexistence of the inputted light.

An operation of the loading resistor will next be explained. A plurality of electrodes are formed in a semiconductor layer as an uppermost layer of the optical functional element laminated with a semiconductor substrate thereon. The substrate is set to a common electrode. In the present invention, the laminated structure of the optical functional element includes a pn junction. A conductivity type of the semiconductor in the uppermost layer is set to A. The conductivity type of a semiconductor layer below the uppermost layer is set to B reverse to the conductivity type of the semiconductor in the uppermost layer. The pn junction is constructed by these semiconductor layers of conductivity types A and B. Accordingly, when a voltage is applied between electrodes in an uppermost portion of the optical functional element, an electric current flows through only the semiconductor layer of conductivity type A in the uppermost layer so that the optical functional element functions as an ohmic resistor. In contrast to this, when a voltage is applied between the substrate and the electrodes in the uppermost portion, there is no light input and the optical functional element has high impedance when the applied voltage is equal to or smaller than the brake-over voltage of the optical functional element. Accordingly, an electric current is interrupted and does not flow through the optical functional element. Namely, in the structure of the optical functional element, it is considered that a layer functioning as a resistor is laminated with an insulator thereon. Such an idea is similarly used even when a resistor layer is further added onto the optical functional element in manufacture of the laminated structure of the optical functional element. When a conductivity type of this added resistor layer is equal to the conductivity type of the uppermost layer of the optical functional element, this resistor layer functions as a resistor together with the uppermost layer of the optical functional element. In contrast to this, when the conductivity type of the added resistor layer is reverse to that of the uppermost layer, only the added layer acts as a resistor layer by the pn junction of the added resistor layer and the uppermost layer of the optical functional element. This added layer is not limited to a single layer. An uppermost layer of the added layer and a layer of the same conductivity type continuously laminated with this uppermost layer therebelow act as a resistor layer.

When such features are used, a certain constructional portion can be used as a resistor by using one portion of the optical functional element laminated with the substrate thereon, and another constructional portion can be used as the optical functional element. Accordingly, the loading resistor required for the optical functional element can be manufactured by the same layer structure as the optical functional element. Further, a resistance value of the loading resistor can be easily controlled by controlling resistivity of the semiconductor layer acting as a resistor.

As mentioned above, in the semiconductor optical functional element of a loading resistor integrated type in the present invention, the semiconductor layer formed in the uppermost layer of the optical functional element is set to a loading resistor. Accordingly, the loading resistor can be manufactured by using the same manufacturing process as the optical functional element. Therefore, a manufacturing process of the loading resistor is simplified in comparison with a general structure of the loading resistor. Further, a resistance value of the loading resistor can be easily controlled by controlling resistivity of a semiconductor. In particular, when the optical functional element is arrayed, the loading resistor can be easily integrated with the optical functional element in the manufacturing process.

Further objects and advantages of the present invention will be apparent from the following description of the preferred embodiments of the present invention as illustrated in the accompanying drawings.

DESCRIPTION OF THE PREFERRED EMBODIMENTS

Figure 1A:
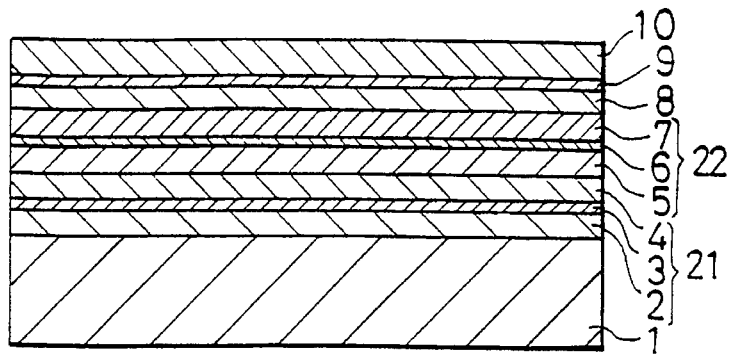
FIGS. 1(a)–1(d) are explanatory views for manufacturing processes and a structure of a semiconductor optical functional element of a loading resistor integrated type in accordance with a first embodiment of the present invention.
Figure 1B:
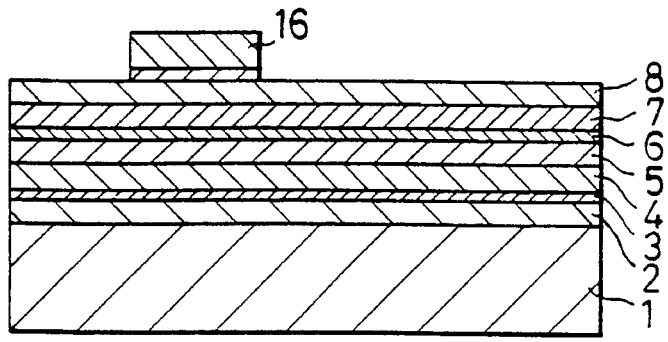
Figure 1C:
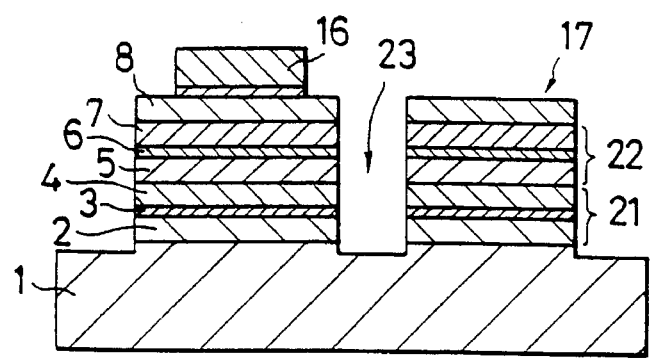
Figure 1D:
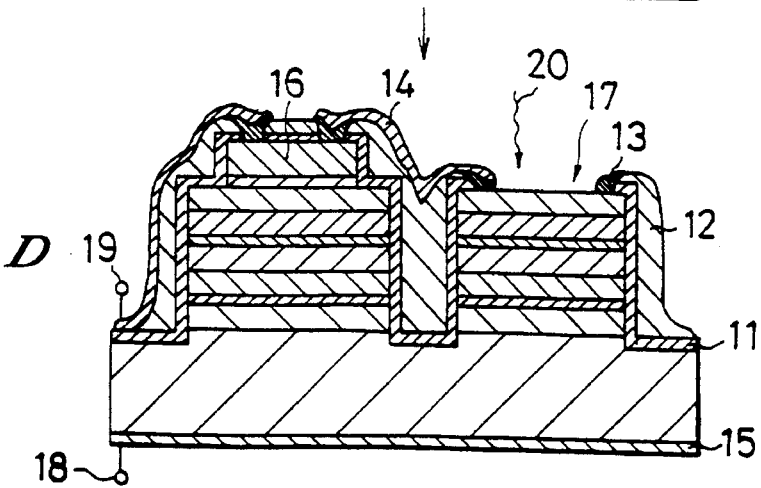

The preferred embodiments of a semiconductor optical functional element of a loading resistor integrated type in the present invention will next be described in detail with reference to the accompanying drawings.

[Embodiment 1]

FIG. 1 shows a semiconductor optical functional element of a loading resistor integrated type in accordance with a first embodiment of the present invention. In this embodiment, a phototransistor (a light receiving portion) 21 and a light emitting diode (a light emitting portion) 22 are integrated with each other as an optical functional element. The phototransistor 21 and a light emitting diode 22 constitute a base of the optical functional element. Further, a semiconductor layer acting as a loading resistor is laminated with the base thereon.

Manufacturing processes of the semiconductor optical functional element of a loading resistor integrated type in the present invention will next be explained in detail with reference to FIG. 1.

First, as shown in a process (a), an n-$Al_{0.4}Ga_{0.6}As$ layer 2, a p-GaAs layer 3 and an n-GaAs layer 4 are sequentially laminated with an n-GaAs substrate 1 thereon by using a metal organic vapor phase epitaxy. The n-$Al_{0.4}Ga_{0.6}As$ layer 2 constitutes an emitter and has a thickness of 0.3 μm. The p-GaAs layer 3 constitutes a base and has a thickness of 0.1 μm. The n-GaAs layer 4 constitutes a collector and has a thickness of 0.7 μm. Then, an n-$Al_{0.4}Ga_{0.6}As$ layer 5, an undoped-$Al_{0.2}Ga_{0.8}As$ layer 6 and a p-$Al_{0.4}Ga_{0.6}As$ layer 7 are sequentially laminated with the n-GaAs layer 4 thereon by the above metal organic vapor phase epitaxy. The n-$Al_{0.4}Ga_{0.6}As$ layer 5 constitutes a clad layer and has a thickness of 1.0 μm. The undoped-$Al_{0.2}Ga_{0.8}As$ layer 6 constitutes an active layer and has a thickness of 0.1 μm. The p-$Al_{0.4}Ga_{0.6}As$ layer 7 constitutes a clad layer and has a thickness of 0.7 μm. Then, a p-GaAs layer 8, an n-$Al_{0.4}Ga_{0.6}As$ layer 9 and an n-GaAs layer 10 are sequentially laminated with the p-$Al_{0.4}Ga_{0.6}As$ layer 7 thereon by the above metal organic vapor phase epitaxy. The p-GaAs layer 8 constitutes a contact layer and has a thickness of 0.6 μm. The n-$Al_{0.4}Ga_{0.6}As$ layer 9 constitutes an etching stop layer and has a thickness of 0.05 μm. The n-GaAs layer 10 constitutes a resistor layer and has a thickness of 0.5 μm.

Next, a resist mask for leaving an element portion formed as a resistor is formed by using a normal photolithography technique. The n-GaAs resistor layer 10 is selectively removed from the above laminated structure by using an etching liquid of ammonia and hydrogen peroxide system. As shown in a process (b), a resistor 16 is formed by removing the n-AlGaAs etching stop layer 9 using an etching liquid of phosphoric acid system in a state in which the resist mask is left as it is.

Next, a resist mask is again formed and an etching operation is performed from the p-GaAs contact layer 8 to the n-GaAs substrate 1 by using an etching liquid of phosphoric acid so that a separating groove 23 is formed to separate optical functional elements from each other. Each of the optical functional elements is designated by reference numeral 17 in a process (c).

After the resist mask is next removed, $SiO_2$ is deposited and formed as an insulating layer 11. Subsequently, the insulating layer 11 is coated with polyimide 12 to bury a step difference of this optical functional element. Then, an element portion for forming an electrode, a portion of polyimide 12 in a light input window portion of the optical functional element 17, and the $SiO_2$ insulating film 11 are removed. Next, an ohmic electrode 13 is formed on each of the resistor and the optical functional element 17. Further, a wiring electrode 14 for connecting the resistor 16 to the optical functional element 17 is formed. Finally, a common electrode 15 is formed on a rear face of the substrate 1. Thus, the manufacturing processes of the optical functional element are completed as shown in a process (d).

In the above semiconductor optical functional element of a loading resistor integrated type, a voltage is applied between an electrode terminal 18 on the rear face of the substrate 1 and an electrode terminal 19 on the resistor 16. When no input light 20 is incident to the optical functional element 17, the optical functional element 17 has high impedance so that the optical functional element 17 is turned off while an electric current is interrupted by the laminated structure below the resistor 16 so that no electric current flows between optical functional elements. In contrast to this, when light 20 is incident to the optical functional element 17, the optical functional element 17 has low impedance so that the optical functional element 17 is turned on. Accordingly, an electric current flows through the optical functional element 17 and the resistor 16. However, the electric current is continuously interrupted by the laminated structure below the resistor 16. Thus, it should be understood that the resistor 16 acts as a loading resistor connected in series to the optical functional element 17. A resistance value of this loading resistor is set by controlling resistivity of the resistor layer.

[Embodiment 2]

Figure 2A:
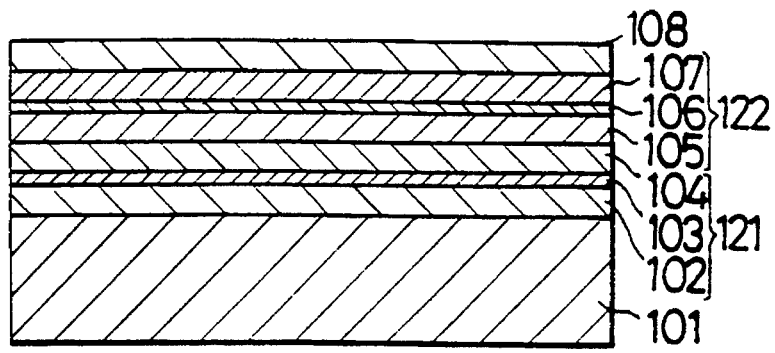
FIGS. 2(a)–2(c) are explanatory views for manufacturing processes and a structure of a semiconductor optical functional element of a loading resistor integrated type in accordance with a second embodiment of the present invention.
Figure 2B:
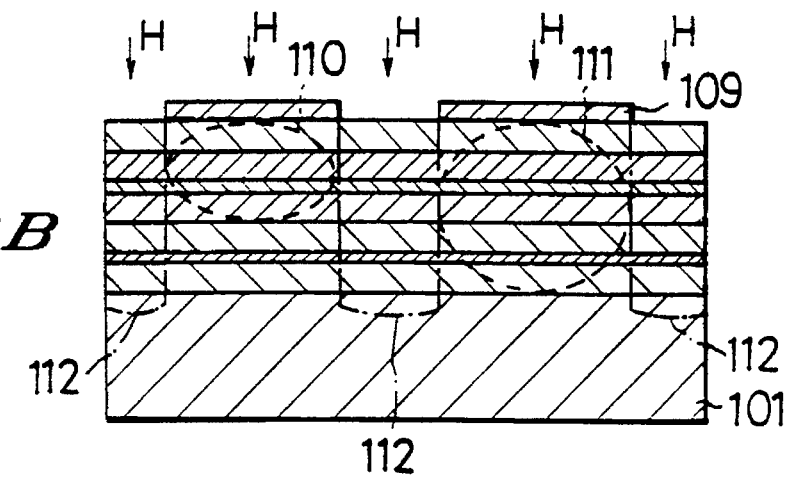
Figure 2C:
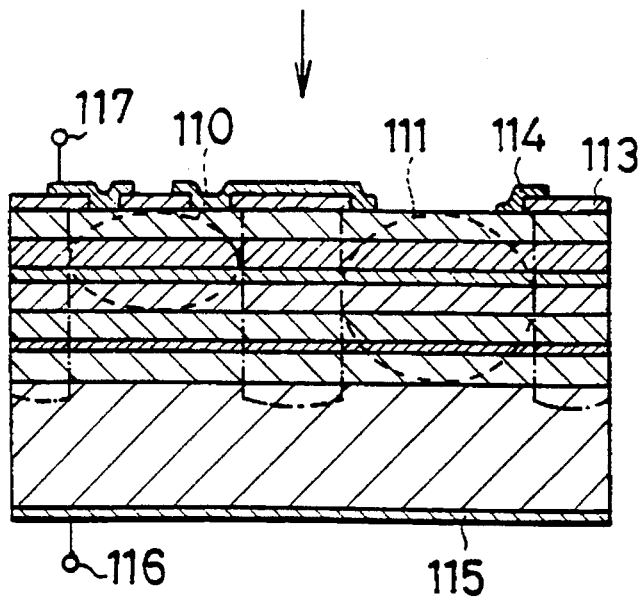
Figure 3A:
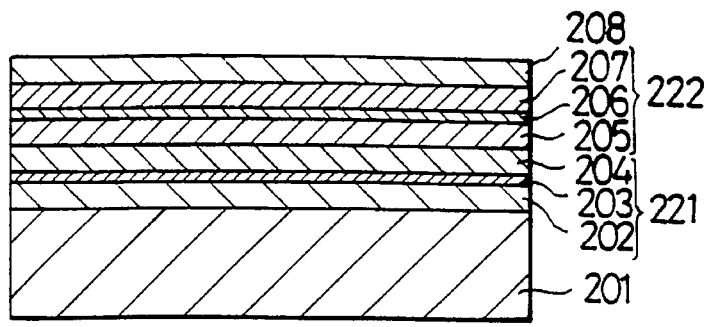
FIGS. 3(a)–3(d) are explanatory views for manufacturing processes and a structure of a semiconductor optical functional element of a loading resistor integrated type in accordance with a third embodiment of the present invention.
Figure 3B:
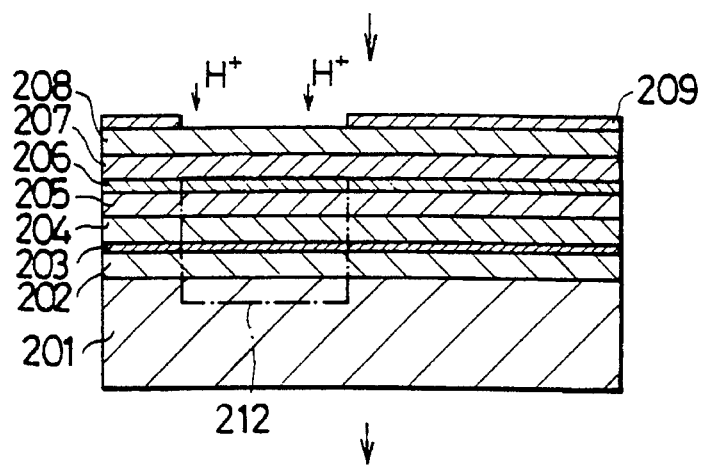
Figure 3C:
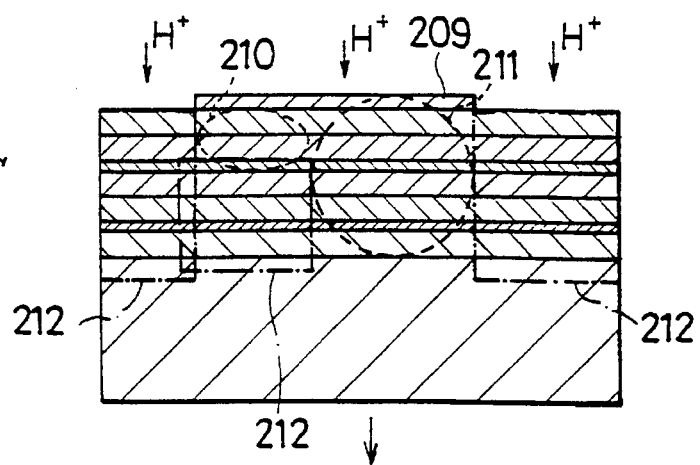
Figure 3D:
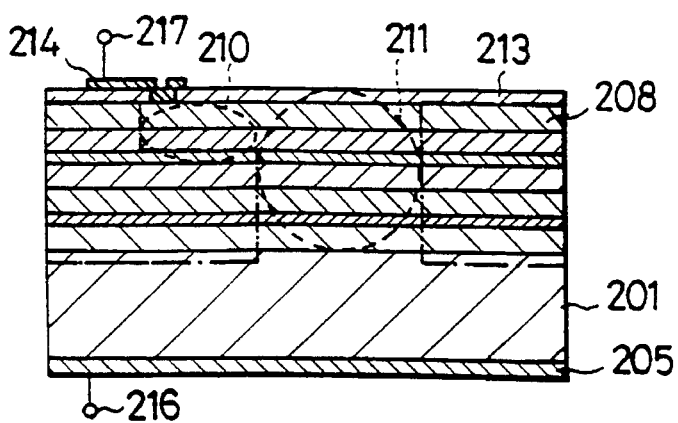

FIG. 2 shows a semiconductor optical functional element of a loading resistor integrated type in accordance with a second embodiment of the present invention. In the second embodiment, a phototransistor (a light receiving portion) 121 and a light emitting diode (a light emitting portion) 122 are integrated with each other as an optical functional element. The phototransistor 121 and the light emitting diode 122 constitute a base of the optical functional element. An uppermost layer portion of the optical functional element is used as a loading resistor as it is.

Manufacturing processes of the semiconductor optical functional element of a loading resistor integrated type in the present invention will next be explained in detail with reference to FIG. 2.

First, as shown in a process (a), an n-$Al_{0.4}Ga_{0.6}As$ layer 102, a p-GaAs layer 103 and an n-GaAs layer 104 are sequentially laminated with an n-GaAs substrate 101 thereon by using a metal organic vapor phase epitaxy. The n-$Al_{0.4}Ga_{0.6}As$ layer 102 constitutes an emitter and has a thickness of 0.2 μm. The p-GaAs layer 103 constitutes a base and has a thickness of 0.1 μm. The n-GaAs layer 104 constitutes a collector and has a thickness of 0.5 μm. Then, an n-$Al_{0.4}Ga_{0.6}As$ layer 105, an undoped-$Al_{0.2}Ga_{0.8}As$ layer 106, a p-$Al_{0.4}Ga_{0.6}As$ layer 107 and a p-GaAs layer 108 are sequentially laminated with the n-GaAs layer 104 thereon by the above metal organic vapor phase epitaxy. The n-$Al_{0.4}Ga_{0.6}As$ layer 105 constitutes a clad layer and has a thickness of 0.5 μm. The undoped-$Al_{0.2}Ga_{0.8}As$ layer 106 constitutes an active layer and has a thickness of 0.1 μm. The p-$Al_{0.4}Ga_{0.6}As$ layer 107 constitutes a clad layer and has a thickness of 0.5 μm. The p-GaAs layer 108 constitutes a contact layer and has a thickness of 0.2 μm.

Next, an SiN layer 109 is deposited as a mask for implanting hydrogen ions. Then, a pattern for electrically separating constructional portions acting as a loading resistor 110 and an optical functional element 111 from each other is formed by using a normal photolithography technique. The SiN layer 109 is removed from the laminated structure in these separating portions. Then, hydrogen ions are implanted into the laminated structure so as to form a high resistance region 112 from the p-GaAs contact layer 108 to the n-$Al_{0.4}Ga_{0.6}As$ emitter layer 102. This high resistance region 112 is shown by a chain line in a process (b). The high resistance region 112 electrically separates the optical functional element 111 from the loading resistor 110.

Next, the SiN layer 109 is once removed. Thereafter, $SiO_2$ is deposited as an insulating layer 113. Then, a constructional portion for forming an electrode and an $SiO_2$ portion in a light input window portion of the optical functional element are removed. An ohmic electrode 114 is formed on each of the loading resistor 110 and the optical functional element 111. The electrode 114 also functions as a wiring electrode. Finally, a common electrode 115 is formed on a rear face of the substrate 101 so that the manufacturing processes are completed as shown in a process (c).

In the semiconductor optical functional element of a loading resistor integrated type in this second embodiment, a voltage is applied between an electrode terminal 116 on a side of the common electrode 115 and an electrode terminal 117 connected to an electrode on the resistor 110.

The second embodiment is characterized in that hydrogen ions are implanted into the laminated structure in a method for electrically separating elements from each other so that no large step difference is formed.

[Embodiment 3]

FIG. 3 shows a semiconductor optical functional element of a loading resistor integrated type in accordance with a third embodiment of the present invention. In the third embodiment, a phototransistor (a light receiving portion) 221 and a light emitting diode (a light emitting portion) 222 are integrated with each other as an optical functional element. The phototransistor 221 and the light emitting diode 222 constitute a base of the optical functional element. An uppermost layer portion of the optical functional element is used as a loading resistor as it is.

Manufacturing processes of the semiconductor optical functional element of a loading resistor integrated type in the present invention will next be explained in detail with reference to FIGS. 3a to 3d.

First, as shown in a process (a), an n-$Al_{0.4}Ga_{0.6}As$ layer 202, a p-GaAs layer 203 and an n-GaAs layer 204 are sequentially laminated with an n-GaAs substrate 201 thereon by using a metal organic vapor phase epitaxy. The n-$Al_{0.4}Ga_{0.6}As$ layer 202 constitutes an emitter and has a thickness of 0.2 µm. The p-GaAs layer 203 constitutes a base and has a thickness of 0.1 µm. The n-GaAs layer 204 constitutes a collector and has a thickness of 0.5 µm. Then, an n-$Al_{0.4}Ga_{0.6}As$ layer 205, an undoped-$Al_{0.2}Ga_{0.8}As$ layer 206, a p-$Al_{0.4}Ga_{0.6}As$ layer 207 and a p-GaAs layer 208 are sequentially laminated with the n-GaAs layer 204 thereon by the above metal organic vapor phase epitaxy. The n-$Al_{0.4}Ga_{0.6}As$ layer 205 constitutes a clad layer and has a thickness of 0.5 µm. The undoped-$Al_{0.2}Ga_{0.8}As$ layer 206 constitutes an active layer and has a thickness of 0.1 µm. The p-$Al_{0.4}Ga_{0.6}As$ layer 207 constitutes a clad layer and has a thickness of 0.5 µm. The p-GaAs layer 208 constitutes a contact layer and has a thickness of 0.2 µm.

Next, an SiN layer 209 is deposited as a mask for implanting hydrogen ions. Then, a pattern for electrically separating constructional portions acting as a loading resistor from each other is formed by using a normal photolithography technique. The SiN layer 209 is removed from the laminated structure in these separating portions. Then, hydrogen ions are implanted into the laminated structure. At this time, implanting dosage and energy of the implanted hydrogen ions are controlled such that no resistivities of the laminated p-GaAs contact layer 208 and the p-$Al_{0.4}Ga_{0.6}As$ clad layer 207 are increased and a constructional portion from the undoped $Al_{0.2}Ga_{0.8}As$ active layer 206 to the n-$Al_{0.4}Ga_{0.6}As$ emitter layer 202 simultaneously has high resistance. Thus, a high resistance region 212 is formed as shown in a process b.

Next, the SiN layer 209 is once removed. Thereafter, a mask for implanting hydrogen ions is again formed and the hydrogen ions are implanted into a separating region of an adjacent optical functional element to separate constructional portions each acting as the optical functional element 211 by using the above photolithography technique. No element separating region is formed between the optical functional element and a loading resistor connected to this optical functional element. A high resistance region 212 formed by this hydrogen ion implantation from the p-GaAs contact layer 208 to the n-$Al_{0.4}Ga_{0.6}As$ emitter layer 202. Thus, the high resistance region 212 electrically separates the constructional portions each acting as the optical functional element 211 from each other so that the loading resistor 210 is directly connected to the optical functional element 211 as shown in a process c.

Next, the SiN layer 209 is removed. Thereafter, $SiO_2$ is deposited as an insulating layer 213 and a constructional portion for an electrode is removed. In this third embodiment, it is not necessary to remove $SiO_2$ from the laminated structure in a light input window portion of the optical functional element 211. At this time, the thickness of $SiO_2$ is set to ¼ times an optical wavelength within $SiO_2$. The $SiO_2$ film is formed as a simple low reflection coating film with respect to incident light. Finally, an ohmic electrode 214 is formed on each of the resistor 210 and the optical functional element 211, and a common electrode 215 is formed on a rear face of the substrate 201 so that the manufacturing processes are completed as shown in a process d.

In the semiconductor optical functional element of a loading resistor integrated type in this third embodiment, a voltage is applied between an electrode terminal 218 on a side of the common electrode 215 and an electrode terminal 217 connected to an electrode on the resistor 210.

In the third embodiment, hydrogen ions are implanted into the laminated structure in a method for electrically separating elements from each other so that no large step difference is formed. Further, the resistor layer and the optical functional element are directly connected to each other. Accordingly, no electrode for wiring the optical functional element 211 and the loading resistor 210 is required so that the optical functional element can be made further compact.

In each of the above embodiments, another laminating means can be used. For example, it is possible to use a growing method such as a molecular beam epitaxy, a liquid phase epitaxy, etc. Further, SiN, etc. can be used as an insulating film. In the first embodiment, it is not necessary to bury the step difference, but another material such as spin-on glass can be used when the step difference is buried. A material for manufacturing the optical functional element can be constructed by using another compound semiconductor material of In-GaAsP, etc. Further, another technique and structure can be used within the scope of features of the present invention.

When the semiconductor optical functional element of a loading resistor integrated type in each of the above first to third embodiments is formed and arranged in one-dimensional or two-dimensional array, the optical functional element having the laminated structure shown in each of process d in FIG. 1, c in FIG. 2 and d in FIG. 3 is manufactured in one-dimensional or two-dimensional array in a direction perpendicular to a paper face. Further, a separating groove reaching a substrate is formed between optical functional elements to electrically separate the optical functional elements from each other. Otherwise, an electrically insulating region may be formed between optical functional elements to electrically separate the optical functional elements from each other. For example, this electrically insulating region is constructed by a high resistance region formed by implantation of hydrogen ions. If the optical functional elements are electrically separated from each other by using the separating groove or the electrically insulating region, it is possible to easily manufacture an array of semiconductor optical functional elements of an integrated type having many sets of loading resistors and optical functional elements.

Many widely different embodiments of the present invention may be constructed without departing from the spirit and scope of the present invention. It should be understood that the present invention is not limited to the specific embodiments described in the specification, except as defined in the appended claims.

What is claimed is:

1. An optical functional element of a plurality of stacked semiconductor layers formed on a substrate in which at least one loading resistor is integrated with the optical functional element;

the optical functional element having a structure in which a phototransistor and a light emitting diode are adjacent to each other and are integrated with each other, or a phototransistor and a laser diode are adjacent to each other and are integrated with each other; and the optical functional element being characterized in that light is fed back from a light emitting portion of the light emitting diode or the laser diode to the phototransistor and that the loading resistor is formed in one of the stacked semiconductor layers constituting the optical functional element, wherein said phototransistor is disposed between said substrate and said loading resistor.

2. An optical functional element according to claim 1, wherein AlGaAs and GaAs are used as the semiconductor layers constituting the optical functional element.

3. An optical functional element according to claim 1, wherein the optical functional element has a thyristor.

4. A semiconductor optical functional element of a loading resistor integrated type according to claim 2, wherein the optical functional element has a thyristor structure.

5. A semiconductor optical functional element of a loading resistor integrated type according to claim 1, wherein said stacked semiconductor layers comprise:

an emitter layer disposed on said substrate;

a base layer disposed on said emitter layer;

a collector layer disposed on said base layer; and a resistor layer disposed over said collector layer.

6. A semiconductor optical functional element of a loading resistor integrated type according to claim 5, wherein said stacked semiconductor layers comprise:

a first clad layer disposed on said collector layer;

an active layer disposed on said first clad layer;

a second clad layer disposed on said active layer; and said resistor layer disposed over said second clad layer.

7. A semiconductor optical functional element of a loading resistor integrated type according to claim 6, wherein said stacked semiconductor layers further comprise:

a contact layer disposed on said second clad layer;

an etch stop layer disposed on said contact layer; and said resistor layer disposed on said etch stop layer.

8. A semiconductor optical functional element of a loading resistor integrated type according to claim 1, wherein:

said phototransistor is disposed on said substrate and comprises emitter, collector and base layers; and said loading resistor comprises a resistor layer disposed over said phototransistor.

9. A semiconductor optical functional element of a loading resistor integrated type according to claim 1, wherein:

said stacked semiconductor layers include a bottom layer disposed directly on said substrate and a plurality of layers disposed over said bottom layer; and said loading resistor is disposed in an uppermost one of said plurality of layers.

* * * * *